US006929471B1

(12) United States Patent
Lee et al.

(10) Patent No.: US 6,929,471 B1
(45) Date of Patent: Aug. 16, 2005

(54) HEAT INSULATION PEDESTAL AND VERTICAL TYPE FURNACE TUBE

(75) Inventors: Dean Lee, Miaoli (TW); Justin Hong, Kinmen (TW); Kun Chan Hsieh, Changhua (TW); Dave H H Lin, Taipei (TW); Affleck Liu, Miaoli (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 10/710,578

(22) Filed: Jul. 22, 2004

(51) Int. Cl.[7] .............................................. F27D 5/00
(52) U.S. Cl. .................... 432/253; 432/227; 211/41.18
(58) Field of Search ................................ 432/253, 258, 432/225, 227, 241; 118/725; 211/41.18

(56) References Cited

U.S. PATENT DOCUMENTS 5,679,168 A * 10/1997 Porter et al. ................ 118/725
5,709,543 A * 1/1998 Shimazu ..................... 432/241
6,607,381 B2 * 8/2003 Minami et al. .............. 432/258

* cited by examiner

Primary Examiner—Gregory Wilson
(74) Attorney, Agent, or Firm—Jiang Chyun IP Office

(57) ABSTRACT

A heat insulation pedestal and a vertical type furnace tube is provided. The heat insulation pedestal is used for supporting the furnace tube. The heat insulation pedestal comprises a top support, a plurality of heat insulation plates and a number of connection sections. The top support has an annular base and a reinforced structure. The reinforced structure and the annular base are connected to provide the top support with a structural strength greater than the annular base. The heat insulation plates are set up below the top support. The connection sections connect the heat insulation plates and connect the top support to one of the heat insulation plates. Because the top support has a structural strength greater than the annular base, the pedestal is prevented from undesirable deformation due to heat.

18 Claims, 5 Drawing Sheets

HEAT INSULATION PEDESTAL AND VERTICAL TYPE FURNACE TUBE

BACKGROUND OF INVENTION

1. Field of the Invention

The present invention relates to a furnace structure. More particularly, the present invention relates to a heat insulation pedestal and a vertical type furnace tube.

2. Description of the Related Art

In the fabrication of semiconductor devices, many steps are often involved. In some of these steps, prolonged high-temperature treatment is frequently required in process such as thermal diffusion. At present, most thermal diffusion processes are commonly carried out using vertical type furnace tubes because a vertical furnace tube typically occupies very little space.

FIG. 1 is a cut away view showing the structure of a conventional vertical type furnace tube. As shown in FIG. 1, the vertical furnace tube 100 mainly comprises an outer furnace tube 102, an inner furnace tube 104, a wafer boat 106, a heat insulation pedestal 108 and wafer boat holder 110. Before carrying out the processing, wafers 112 are placed inside the wafer boat 106 and then the wafer boat 106 is raised from the bottom section of the inner tube 104 into the interior of the inner tube 104. The pedestal 108 is located inside the inner tube 104 below the wafer boat 106. The wafer boat holder 110 is set up between the wafer boat 106 and the pedestal 108.

After performing a conventional high-temperature thermal treatment such as a well diffusion process inside a conventional vertical furnace tube, some of the wafers are broken as a result of abnormal transport. On close examination, the principal reason is found to be the deformation of the heat insulation pedestal. The cause of pedestal deformation is explained in more detail in the following with reference to FIGS. 2A and 2B.

FIGS. 2A and 2B are the perspective view and the side view of section II of the pedestal in FIG. 1. As shown in FIGS. 2A and 2B, the heat insulation pedestal 108 comprises a top support 202, a plurality of heat insulation plates 204 and a number of connection sections 206. The top support 202 is used for supporting the wafer boat 106 and the wafer boat holder 110 (see FIG. 1). The heat insulation plates 204 are set up under the top support 202. The connection sections 206 connect various heat insulation plates 204 to the top support 202. The heat insulation pedestal 108 deforms mainly because the wafer boat 106, the wafer boat holder 110 and the wafers 112 (see FIG. 1) weigh down on the top support 202 during a lengthy high temperature processing operation. The deformation of the top support 202 often leads to a tilting of the wafer boat 106 and hence increasing the likelihood of wafer damage 112 during transportation.

To prevent damage to the wafer products, the heat insulation pedestal of the vertical type furnace tube in a production line must be replaced at fixed interval. However, replacing the pedestal not only costs a lot of money but also wastes a lot of processing time. Ultimately, productivity of the thermal processing operation is reduced.

SUMMARY OF INVENTION

Accordingly, at least one objective of the present invention is to provide a heat insulation pedestal that resist deformation at a high operating temperature.

At least a second objective of the present invention is to provide a vertical type furnace tube capable of reducing production cost and increasing productivity.

To achieve these and other advantages and in accordance with the purpose of the invention, as embodied and broadly described herein, the invention provides a heat insulation pedestal for a furnace. The heat insulation pedestal comprises a top support, a plurality of heat insulation plates and a number of connection sections. The top support has an annular base and a reinforced structure. The reinforced structure and the annular base are connected to provide the top support with an overall structural strength greater than the annular base. The heat insulation plates are set up below the top support. The connection sections connect various heat insulation plates and connect the top support to one of the heat insulation plates.

According to the heat insulation pedestal of this embodiment, the annular base and the reinforced structure are combined to form an integrative unit. In addition, the annular base and the reinforced structure can be combined to form a top support having a drum shape configuration or a cylinder shape configuration.

The present invention also provides a vertical type furnace tube. The furnace tube comprises an outer tube, an inner tube, a wafer board and a heat insulation pedestal. The inner tube is located inside the outer tube. The wafer boat is set up inside the inner tube. The heat insulation pedestal is positioned inside the inner tube below the wafer boat. The heat insulation pedestal further comprises a top support for supporting the wafer boat, a plurality of heat insulation plates and a number of connection sections. The top support further comprises an annular base and a reinforced structure. The reinforced structure and the annular base are connected to provide the top support with an overall structural strength greater than the annular base. The heat insulation plates are set up below the top support. The connection sections connect various heat insulation plates and connect the top support to one of the heat insulation plates.

According to the vertical furnace tube of this embodiment, the annular base and the reinforced structure are combined to form an integrative unit. In addition, the annular base and the reinforced structure can be combined to form a top support having a drum shape configuration or a cylinder shape configuration.

In the present invention, a reinforced structure is incorporated to the annular base to form a drum shape or a cylinder shape top support having an enhanced structural strength. Thus, the heat insulation pedestal is more resistant to structural deformation than a conventional top support. Moreover, the structure can be fabricated through a modification of an existent top support structure using scrap material. Because the frequency of yearly pedestal replacement can be significantly reduced, productivity is increased and production time is shortened.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
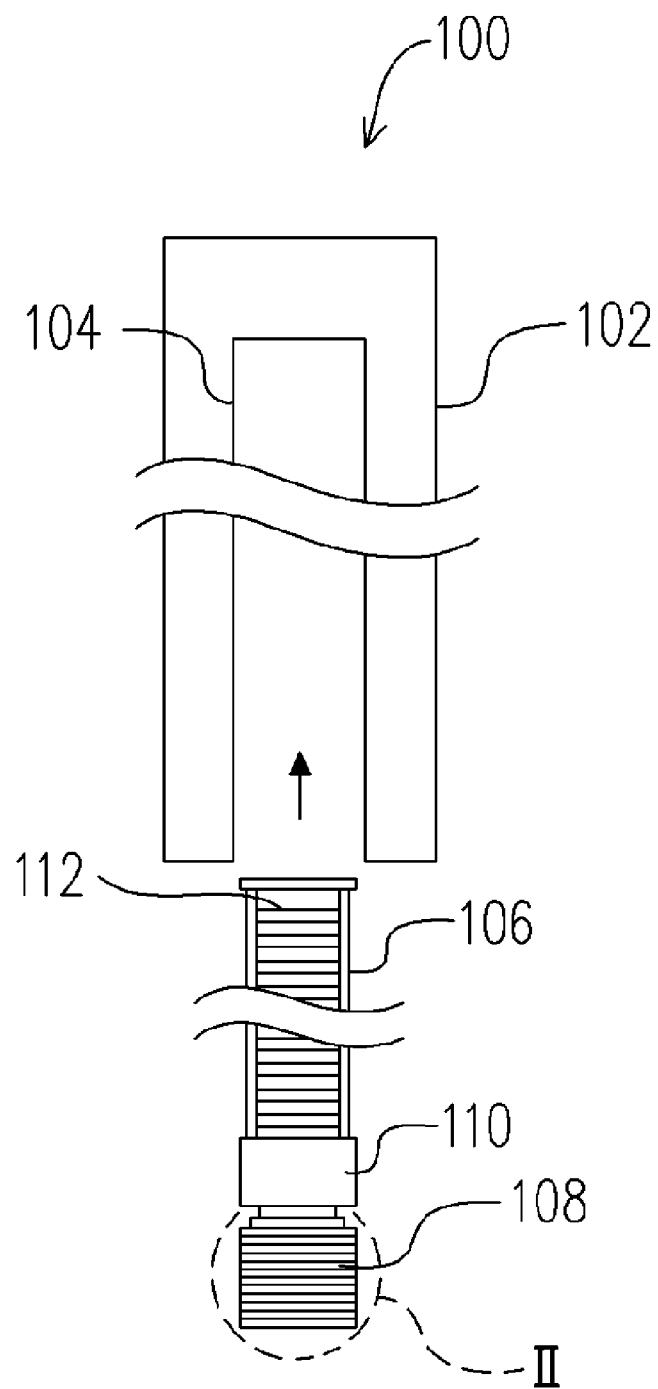
FIG. 1 is a cut away view showing the structure of a conventional vertical type furnace tube.
Figure 2A:
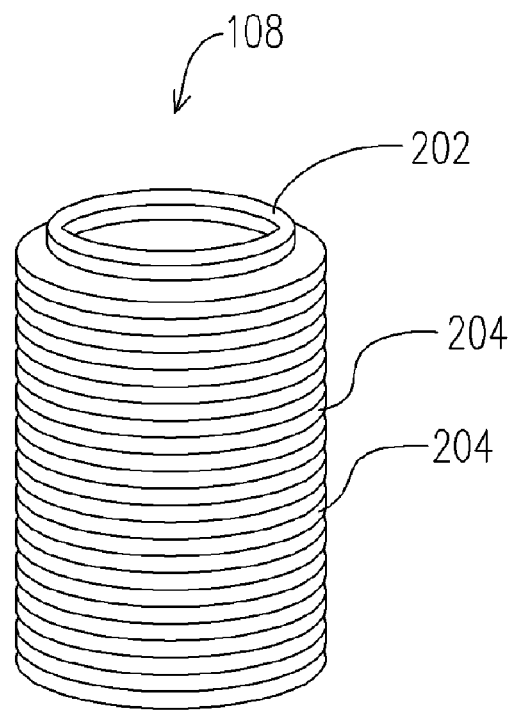
FIGS. 2A and 2B are the perspective view and the side view of section II of the pedestal in FIG. 1.
Figure 2B:
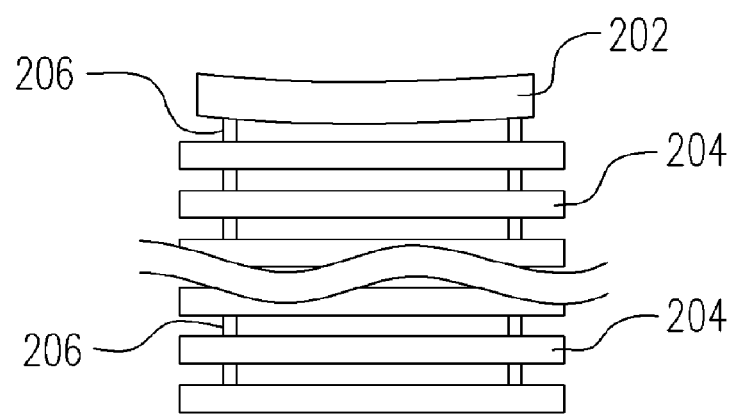

Reference will now be made in detail to the present preferred embodiments of the invention, examples of which are illustrated in the accompanying drawings. Wherever possible, the same reference numbers are used in the drawings and the description to refer to the same or like parts.

Figure 3:
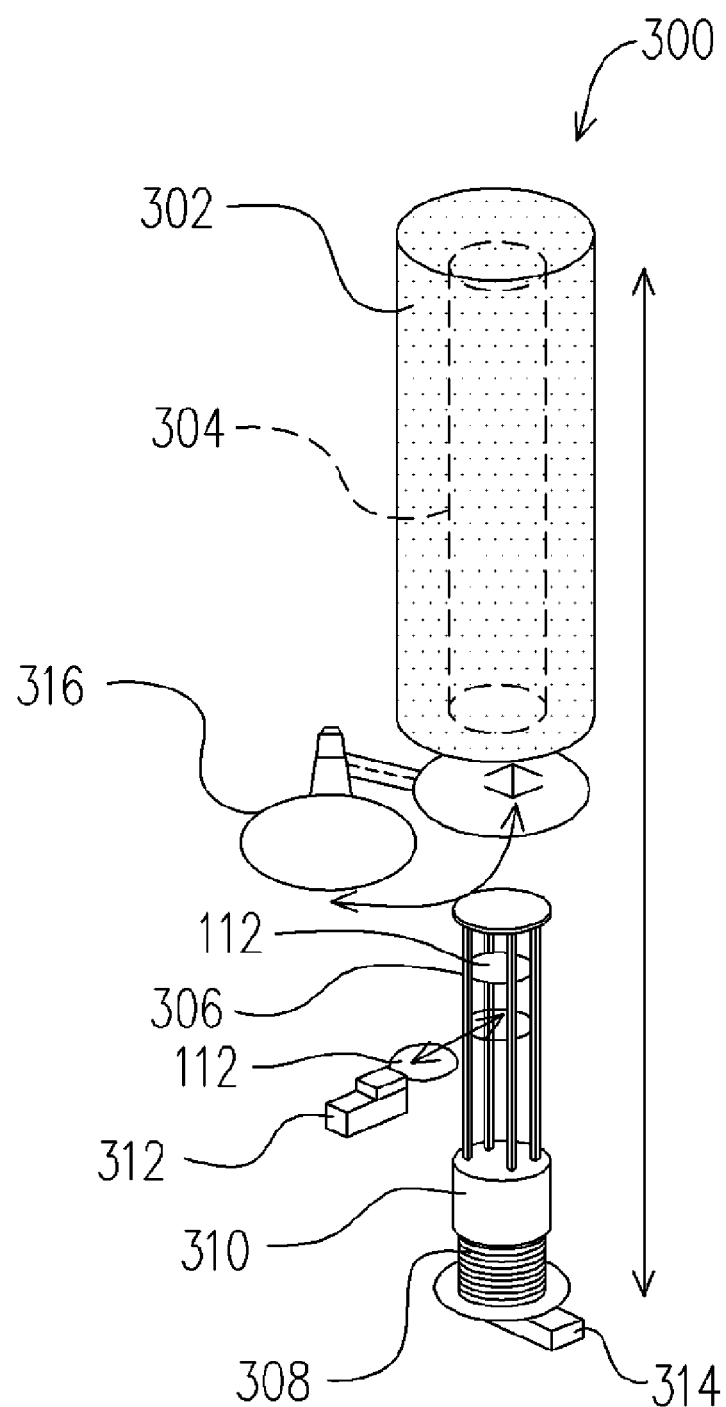
FIG. 3 is a perspective view of a vertical type furnace tube according to one preferred embodiment of the present invention.

FIG. 3 is a perspective view of a vertical type furnace tube according to one preferred embodiment of the present invention. As shown in FIG. 3, the vertical furnace tube 300 mainly comprises an outer furnace tube 302, an inner surface tube 304, a wafer boat 306, a heat insulation pedestal 308 and an optional wafer boat holder 310. The wafer boat 306 and the wafer boat holder 310 are fabricated using silicon carbide (SiC), for example. The inner tube 304 is located inside the outer tube 302 and the heat insulation pedestal 308 is located under the wafer boat 306. The wafer boat holder 310 is set up between the wafer boat 306 and the heat insulation pedestal 308 for increasing the height level of the wafer boat 306. The inner tube 304 is fabricated using a refractory material including, for example, silicon carbide, silicon carbide coated graphite, graphite, quartz, silicon, ceramic, aluminum nitride, aluminum oxide, silicon nitride, magnesium oxide or chromium oxide.

Figure 4A:
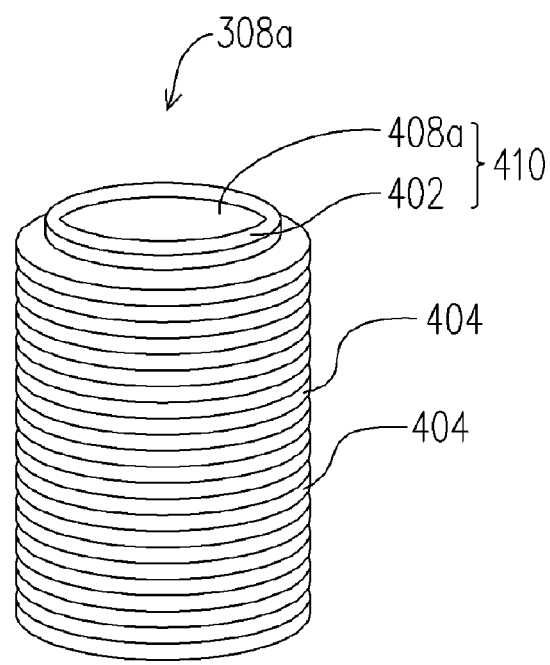
FIG. 4A is a perspective view of the pedestal in FIG. 3 according to a first embodiment of the present invention.
Figure 4B:
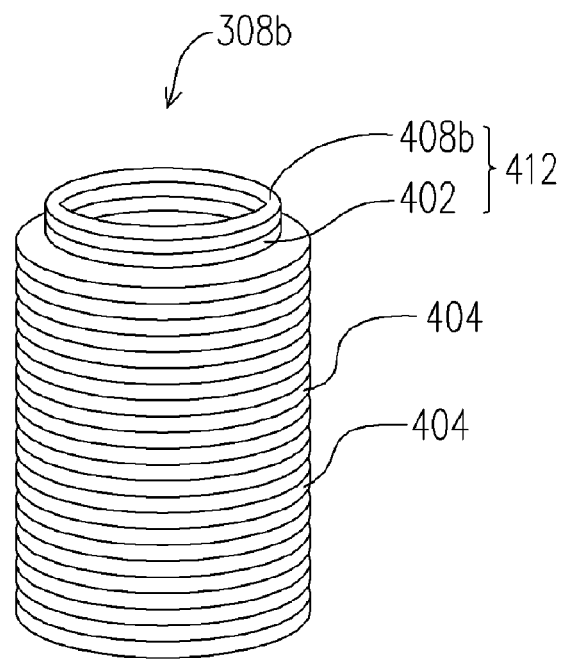
FIG. 4B is a perspective view of the pedestal in FIG. 3 according to a second embodiment of the present invention.
Figure 5:
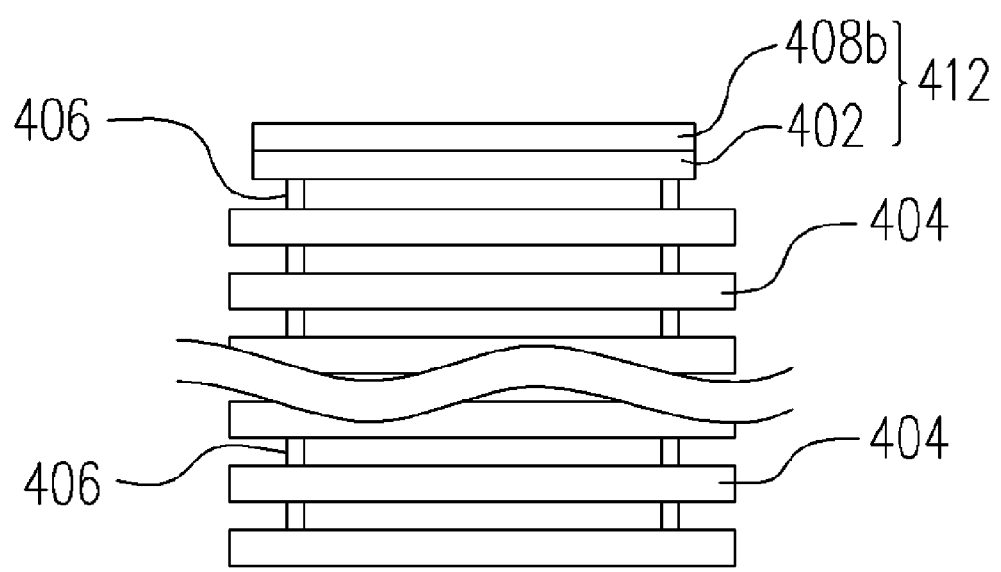
FIG. 5 is a cross-sectional view of the pedestal in FIG. 4B.

Before carrying out some actual processing, wafers 112 are placed inside the wafer boat 306 using a transport device 312. With the pedestal 308 supporting the wafer boat 306 and the wafer boat holder 310, a elevating device 314 underneath the pedestal 308 is used to lift the wafer boat 306 from the bottom of the inner tube 304 into the interior of the inner tube 304. Thereafter, a shutter 316 outside the inner tube 304 seals off the inner tube 304. In general, the vertical furnace tube 300 also needs to include a heating element (not shown) surrounding the outer tube 302 to heat up the outer tube 302 and a thermal couple inside the outer tube 302 for measuring surrounding temperature. Detail structure of the heat insulation pedestal 308 is shown in FIGS. 4A, 4B and 5. FIG. 4A is a perspective view of the pedestal in FIG. 3 according to a first embodiment of the present invention. FIG. 4B is a perspective view of the pedestal in FIG. 3 according to a second embodiment of the present invention. FIG. 5 is a cross-sectional view of the pedestal in FIG. 4B.

As shown in FIG. 4A, the heat insulation pedestal 308a comprises a top support 410, a plurality of heat insulation plates 404 and a number of connection sections (not shown). The top support 410 further comprises an annular base 402 and a reinforced structure 408a. The reinforced structure 408a and the annular base 402 are joined together so that overall structural strength of the top support 410 is greater than the annular base 402. For example, the annular base 402 and the reinforced structure 408a of the heat insulation pedestal 308a form a drum shape top support 410. The annular base 402 and the reinforced structure 408a of the top support 410 are formed as an integrated unit. The heat insulation plates 404 are set up below the top support 410. In addition, the heat insulation plates 404, the top support 410 and the connection sections are all fabricated using a material such as quartz.

The heat insulation pedestal 308b in FIG. 4B differs from the one in FIG. 4A mainly in the way the annular base 402 and the reinforced structure 408b are combined together. The annular base 402 and the reinforced structure 408b of the pedestal 308b are joined to form a cylinder shape top support 412 that produces an overall structural strength greater than the annular base 402. Although the configuration of the top support is illustrated using examples as shown in FIGS. 4A and 4B, other types of modifications to the reinforced structure to produce the top support is permitted and hence should be included within the scope of the present invention.

Furthermore, the structure according to the present invention can be used for a prolonged period of time without causing any abnormal wafer transportation. As shown in FIG. 5, the heat insulation pedestal comprises a top support 412, a set of heat insulation plates 404 and a set of connection sections 406. The connection sections 406 connect various heat insulation plates 404 and the top support 412 to one of the heat insulation plate 404. Table 1 lists out the amount of deformation of the strengthened pedestal according the present invention and a conventional pedestal after 14 months of continuous use. According to the table, the amount of deformation in the reinforced pedestal is only 0.116 mm compared with the deformation in the conventional pedestal of about 1 mm.

TABLE 1

| Deformation comparison (units in mm) | | | | | |
|---|---|---|---|---|---|
| | Conventional Design | | | The design of the present invention | |
| | New Product | After 14 months | | New Product | After 14 months |
| The lowest point | −0.017 | −0.562 | −0.6 | −0.018 | −0.053 |
| The highest point | 0.023 | 0.447 | 0.503 | 0.021 | 0.063 |
| Amount of deformation | 0.04 | 1.009 | 1.103 | 0.039 | 0.116 |

In summary, major aspect of the present invention includes:

1. With a reinforced structure added to form a "drum shape" or a "cylinder shape" top support, the heat insulation pedestal is strengthened to reduce the amount of deformation and deformation-caused transport problems.

2. Scrap material can be used to form the structural reinforcement to reduce overall production cost.

3. Because the frequency of pedestal replacement is reduced when the top support is reinforced, overall productivity is increased while production time is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An heat insulation pedestal for a furnace tube, comprising:
   a top support having an annular base and a reinforced structure, wherein the reinforced structure and the annular base are joined together such that the top support has a structural strength greater than the annular base;
   a plurality of heat insulation plates set up under the top support; and
   a plurality of connection sections connecting various heat insulation plates and the top support with one of the heat insulation plates.

2. The pedestal of claim 1, wherein the annular base and the reinforced structure of top support are formed together as an integrated unit.

3. The pedestal of claim 1, wherein the annular base and the reinforced structure together form a drum shape top support.

4. The pedestal of claim 1, wherein the annular base and the reinforced structure together form a cylinder shape top support.

5. The pedestal of claim 1, wherein the heat insulation plates, the top support and the connection sections are all fabricated using an identical material.

6. The pedestal of claim 1, wherein material constituting the heat insulation plates comprises quartz.

7. The pedestal of claim 1, wherein material constituting the top support comprises quartz.

8. The pedestal of claim 1, wherein material constituting the connection sections comprises quartz.

9. A vertical type furnace tube, comprising:
   an outer tube;
   an inner tube set up within the outer tube;
   a wafer boat set up within the inner tube; and
   a heat insulation pedestal set up inside the inner tube under the wafer boat, wherein the heat insulation pedestal further comprises:
   a top support for supporting the wafer boat, wherein the top support comprises an annular base and a reinforced structure joined together such that the top support has an overall structural strength greater than the annular base;
   a plurality of heat insulation plates set up under the top support; and
   a plurality of connection sections connecting various heat insulation plates and the top support to one of the heat insulation plates.

10. The furnace tube of claim 9, wherein the annular base and the reinforced structure of the top support are fabricated together to form an integrated unit.

11. The furnace tube of claim 9, wherein the annular base and the reinforced structure together form a drum shape top support.

12. The furnace tube of claim 9, wherein the annular base and the reinforced structure together form a cylinder shaped top support.

13. The furnace tube of claim 9, wherein the heat insulation plates, the top support and the connection sections are all fabricated using an identical material.

14. The furnace tube of claim 9, wherein the furnace tube further comprises a wafer boat holder located between the wafer boat and the heat insulation pedestal.

15. The furnace tube of claim 14, wherein material constituting the wafer boat holder comprises silicon carbide.

16. The furnace tube of claim 9, wherein the furnace tube further comprises:
   a elevating device set up under the heat insulation pedestal for moving the wafer boat into and out of the inner tube;
   a shutter set up outside the inner tube for sealing the inner tube before performing a thermal operation;
   a heating element set up around the outer tube for heating the outer tube; and
   a thermocouple set up inside the inner tube for measuring ambient temperature.

17. The furnace tube of claim 9, wherein material constituting the wafer boat comprises silicon carbide.

18. The furnace tube of claim 9, wherein material constituting the heat insulation pedestal comprises quartz.

* * * * *